(12) United States Patent
Eid et al.

(10) Patent No.: US 11,854,932 B2
(45) Date of Patent: Dec. 26, 2023

(54) PACKAGE WRAP-AROUND HEAT SPREADER

(71) Applicant: Intel Corporation, Santa Clara, CA (US)

(72) Inventors: Feras Eid, Chandler, AZ (US); Chandra Mohan Jha, Tempe, AZ (US); Je-Young Chang, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 857 days.

(21) Appl. No.: 16/721,122

(22) Filed: Dec. 19, 2019

(65) Prior Publication Data

US 2021/0193549 A1 Jun. 24, 2021

(51) Int. Cl.
| | |
|---|---|
| *H01L 23/36* | (2006.01) |
| *H01L 23/367* | (2006.01) |
| *H01L 23/373* | (2006.01) |
| *H01L 23/48* | (2006.01) |

(52) U.S. Cl.
CPC ........ *H01L 23/3672* (2013.01); *H01L 23/373* (2013.01); *H01L 23/481* (2013.01)

(58) Field of Classification Search
CPC .............. H01L 23/367; H01L 23/3675; H01L 23/3677; H01L 23/42; H01L 23/3672; H01L 2023/4068; H01L 21/4871; H05K 1/0206; H05K 1/181; H05K 7/20409
USPC ................. 257/712, 713, E23.104, E23.097, 257/E23.105, E23.101; 361/720, 792
See application file for complete search history.

(56) References Cited

U.S. PATENT DOCUMENTS

| | | | |
|---|---|---|---|
| 4,882,454 A | 11/1989 | Peterson | |
| 6,751,099 B2* | 6/2004 | Vrtis | .................... H01L 23/3737 524/270 |
| 8,642,386 B2* | 2/2014 | Lu | ....................... H01L 21/6836 438/114 |

(Continued)

FOREIGN PATENT DOCUMENTS

| | | |
|---|---|---|
| DE | 202006019685 | 3/2007 |
| DE | 102008040501 | 1/2010 |

(Continued)

OTHER PUBLICATIONS

Search Report from European Patent Application No. 20197700.6 dated Mar. 23, 2021, 14 pages.

*Primary Examiner* — Mandeep S Buttar
(74) *Attorney, Agent, or Firm* — Schwabe, Williamson & Wyatt, P.C.

(57) ABSTRACT

Embodiments disclosed herein include electronic packages and thermal solutions for such electronic packages. In an embodiment, an electronic package comprises, a package substrate with a first surface, a second surface opposite from the first surface, and a sidewall surface connecting the first surface to the second surface. In an embodiment, the electronic package further comprises a heat spreader, where a first portion of the heat spreader is attached to the first surface of the package substrate and a second portion of the heat spreader is attached to the second surface of the package substrate. In an embodiment, a third portion of the heat spreader adjacent to the sidewall surface of the package substrate connects the first portion of the heat spreader to the second portion of the heat spreader.

26 Claims, 10 Drawing Sheets

(56) References Cited

U.S. PATENT DOCUMENTS

| | | | |
|---|---|---|---|
| 2011/0007479 A1* | 1/2011 | Tam | H01L 25/0652 |
| | | | 29/830 |
| 2013/0314920 A1* | 11/2013 | Park | H01L 23/3677 |
| | | | 362/249.02 |
| 2014/0252645 A1* | 9/2014 | Kim | H01L 23/5384 |
| | | | 257/774 |
| 2014/0306335 A1* | 10/2014 | Mataya | H01L 23/3677 |
| | | | 977/734 |
| 2015/0301568 A1* | 10/2015 | Hill | G06F 1/20 |
| | | | 29/890.03 |
| 2016/0242321 A1* | 8/2016 | van Haaster | H05K 7/20509 |
| 2017/0256474 A1* | 9/2017 | Fujinaga | H01L 23/49838 |
| 2017/0352612 A1* | 12/2017 | Sung | H01L 21/486 |
| 2019/0131209 A1 | 5/2019 | Woods | |
| 2019/0348341 A1* | 11/2019 | Pax | H01L 25/50 |

FOREIGN PATENT DOCUMENTS

| | | |
|---|---|---|
| EP | 0165705 | 12/1985 |
| EP | 2717659 | 4/2014 |
| FR | 2699039 | 6/1994 |

\* cited by examiner

PACKAGE WRAP-AROUND HEAT SPREADER

TECHNICAL FIELD

Embodiments of the present disclosure relate to semiconductor devices, and more particularly to wrap-around heat spreaders to provide improved thermal control of multi-die packages.

BACKGROUND

Higher performance, lower cost, and greater packaging density of integrated circuits are ongoing goals of the microelectronic industry. To achieve these goals, microelectronic devices are continuously miniaturized and/or stacked in 3D architectures. While 3D architectures allow for improved density, thermal management becomes a significant challenge for such devices due to the high power density of the components, the compounding impact of hot spots from multiple dies, and the high thermal resistance usually experienced by the bottom dies. Thermal management is a critical concern for 3D packages, because the integrated circuits in those devices may be damaged or destroyed if the temperature of the microelectronic device raises too high.

However, existing thermal solutions, such as an integrated heat spreader (IHS) that interfaces with only the top dies, do not provided the needed cooling for the bottom dies in a stack. For example, the primary thermal path from the bottom die in a multi-die stack to the IHS passes through low thermal conductivity layers such as underfill or mold compound. Similarly, in double sided systems (i.e., with a die module both above and below the package substrate), the primary thermal path from the bottom die module to the IHS passes through the package substrate.

Underfills, mold compounds, and package substrates are predominantly made of organic materials, and improvements to thermal conductivity of organic materials are severely limited by material properties. Additionally, attempts to reduce thermal resistance by improving the performance of the thermal interface material (TIM) or underfills only provides incremental improvements. Such incremental improvements do not scale with future generations as the power dissipated by the dies continues to increase. In the case of a double sided system, a second thermal solution (e.g., a second IHS) for the bottom die is not always possible due to cost and size limitations.

EMBODIMENTS OF THE PRESENT DISCLOSURE

Figure 1A:
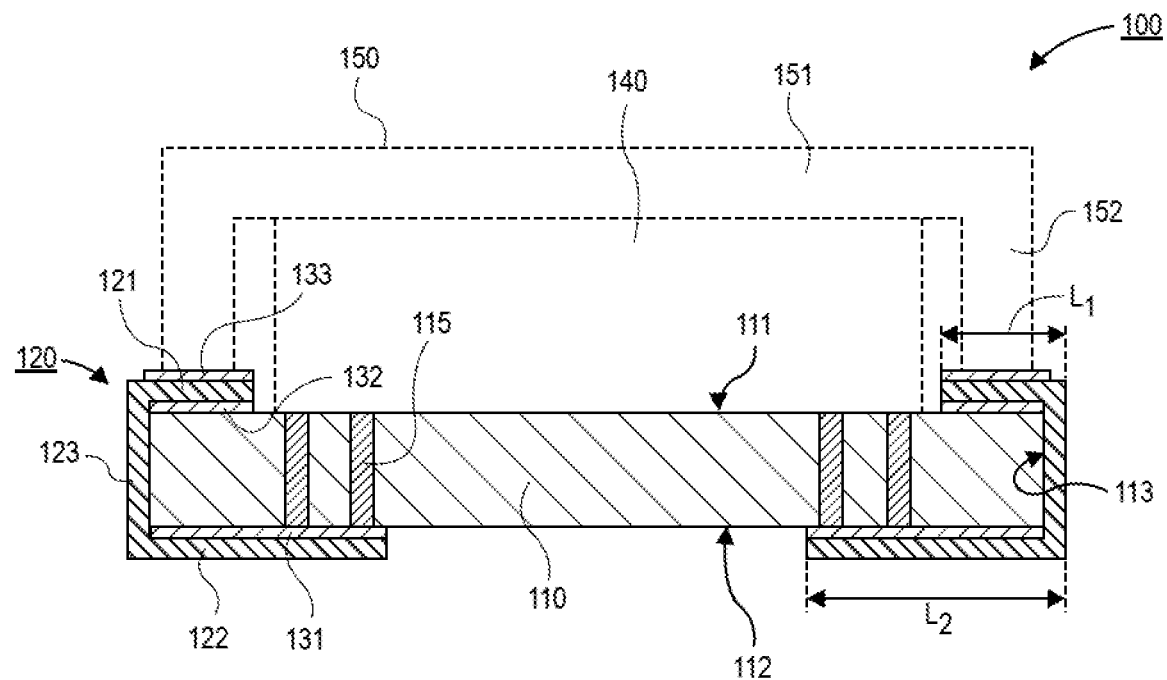
FIG. 1A is a cross-sectional illustration of an electronic package with a wrap-around heat spreader (WAHS), in accordance with an embodiment.

Described herein are electronic packages with wrap-around heat spreaders to provide improved thermal control of multi-die packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal management of 3D packaging architectures is limited by layers or components such as underfills, mold compounds, or package substrates that have a low thermal conductivity. Accordingly, heat is not easily propagated from the bottom dies to the integrated heat spreader (IHS). Therefore, embodiments disclosed herein include thermal solutions that provide high thermal conductivity paths from the bottom dies to the IHS.

In a particular embodiment, the high thermal conductivity path includes a flexible heat spreader that wraps around the package substrate. Such a heat spreader may be referred to as a wrap-around heat spreader (WAHS). A first portion of the WAHS may be secured to the top surface of the package substrate and a second portion of the WAHS may be secured to the bottom surface of the package substrate. A third portion of the WAHS wraps along the sidewall of the package substrate to connect the first portion of the WAHS to the second portion of the WAHS. In an embodiment, supports of the IHS are secured to the first portion of the WAHS.

In an embodiment, the WAHS has high in-plane thermal conductivity. For example, the WAHS may comprise graphene or high conductivity graphite sheets, a heat pipe, a vapor chamber, or the like. In some embodiments, thermal features (e.g., vias, thermal slugs, etc.) that pass through a thickness of the package substrate may thermally couple the bottom dies to the WAHS. Accordingly, a high thermal conductivity path from the bottom dies to the IHS is provided.

In some embodiments, the electronic package comprises a first die module on a top surface of the package substrate and a second die module on the bottom surface of the package substrate. In such embodiments, the WAHS provides a high thermal conductivity path from the bottom die module to the IHS. As such, there is no need for a second thermal solution dedicated to the bottom die module.

Referring now to FIG. 1A, a cross-sectional illustration of an electronic package 100 is shown, in accordance with an embodiment. In FIG. 1A, a die module 140 and an integrated heat spreader (IHS) 150 are illustrated with dashed lines to indicate that any suitable die module 140 or IHS 150 may be integrated with the electronic package 100. More detailed descriptions of the die module 140 and the IHS 150 are provided below.

In an embodiment, the electronic package 100 comprises a package substrate 110. The package substrate may be an organic package substrate. The package substrate 110 may comprise a plurality of layers laminated over each other. For example, the package substrate 110 may comprise a plurality of layers of buildup film (BF), or the like. In an embodiment, the package substrate 110 may comprise conductive features (e.g., traces, vias, etc.) for routing electrical paths from a first surface 111 of the package substrate 110 to a second surface 112 of the package substrate 110. The conductive features for electrical routing are not shown for simplicity.

However, thermal routing is shown in the package substrate 110. For example, one or more thermal vias 115 may pass from the first surface 111 to the second surface 112 of the package substrate. Accordingly, heat generated from the die module 140 may rapidly pass from the first surface 111 to the second surface 112 of the package substrate 110, despite the low thermal conductivity of the organic material of the package substrate 110. In an embodiment, the thermal vias 115 are dedicated for thermal purposes. That is, in some embodiments, the thermal vias 115 are not held at any particular voltage. In other embodiments, the thermal vias 115 may be part of a ground plane and, therefore, may be held at a certain voltage. In the illustrated embodiment, the thermal vias 115 are shown as having substantially vertical sidewalls. In other embodiments, the thermal vias 115 may have tapered sidewalls, typical of laser drilling in package manufacturing. Additionally, the thermal vias 115 may include alternating vias and pads through a thickness of the package substrate 110.

In an embodiment, the electronic package 100 may further comprise a WAHS 120. In an embodiment, the WAHS may comprise a first portion 121 secured to the first surface 111, a second portion 122 secured to the second surface 112, and a third portion 123 that wraps along a sidewall surface 113 of the package substrate 110. In an embodiment, the first portion 121 may be secured to the first surface 111 with a sealant 132 or other adhesive material. In an embodiment, the second portion 122 is secured to the second surface 112 with a thermal interface material (TIM) 131. The use of a TIM allows for thermal energy to pass from the thermal vias 115 to the WAHS 120 with minimal thermal resistance. In an embodiment, TIMs disclosed herein may be any suitable TIM materials, such as solder or polymer TIMs, or adhesives with high thermal conductivities (e.g., metal filled epoxies).

In an embodiment, the WAHS 120 has a high in-plane thermal conductivity. The high in-plane thermal conductivity allows for thermal energy to easily propagate between the second portion 122 and the first portion 121. In a particular embodiment, the WAHS 120 comprises a flexible material. The use of a flexible material allows for a monolithic WAHS 120 to wrap over the sidewall 113 between the first portion 121 and the second portion 122. In an embodiment, the WAHS 120 may comprise graphene or high conductivity graphite sheets, a heat pipe, a vapor chamber, or any combination thereof.

In an embodiment, the first portion 121 of the WAHS 120 may be thermally coupled to the IHS 150. Particularly, supports 152 extending down from a main body 151 are coupled to the first portion 121 of the WAHS 120. For example, a TIM 133 may be between the supports 152 and the first portion 121 of the WAHS 120. Accordingly, a low thermal resistance path from the die module 140 to the IHS 150 is provided. In an embodiment, the primary low thermal resistance path may include the thermal vias 115, the TIM 131, the WAHS 120, the TIM 133, and the supports 152 of the IHS 150. Such a low thermal resistance path allows for improved thermal control of the die module 140 since the primary thermal path no longer needs to pass through organic materials such as mold or underfill layers (not shown) in the stack comprising the die module.

In an embodiment, a pair of WAHSs 120 are provided along opposing sidewalls 113 of the package substrate 110. In some embodiments, a single WAHS 120 is provided. In other embodiments, more than two WAHSs 120 may be included, as will be described in greater detail below.

In an embodiment, the WAHS 120 may have any suitable dimensions to accommodate the architecture of the electronic package 100. For example, the WAHS 120 may be routed around interconnects or other components on the surfaces 111 or 112 of the package substrate 110. In a particular embodiment, a first length $L_1$ of the first portion 121 may be smaller than a second length $L_2$ of the second portion 122. For example, the first length $L_1$ may be such that the first portion 121 remains outside of a footprint of the die module 140, and the second length $L_2$ may be such that the second portion 122 at least partially extends under the footprint of the die module 140. Extending the second portion 122 under the footprint of the die module 140 allows for the primary thermal path to be substantially vertical through a thickness of the package substrate 110. That is, horizontal propagation of the thermal energy may be implemented by the WAHS 120 that has superior in-plane thermal conductivity.

Figure 1B:
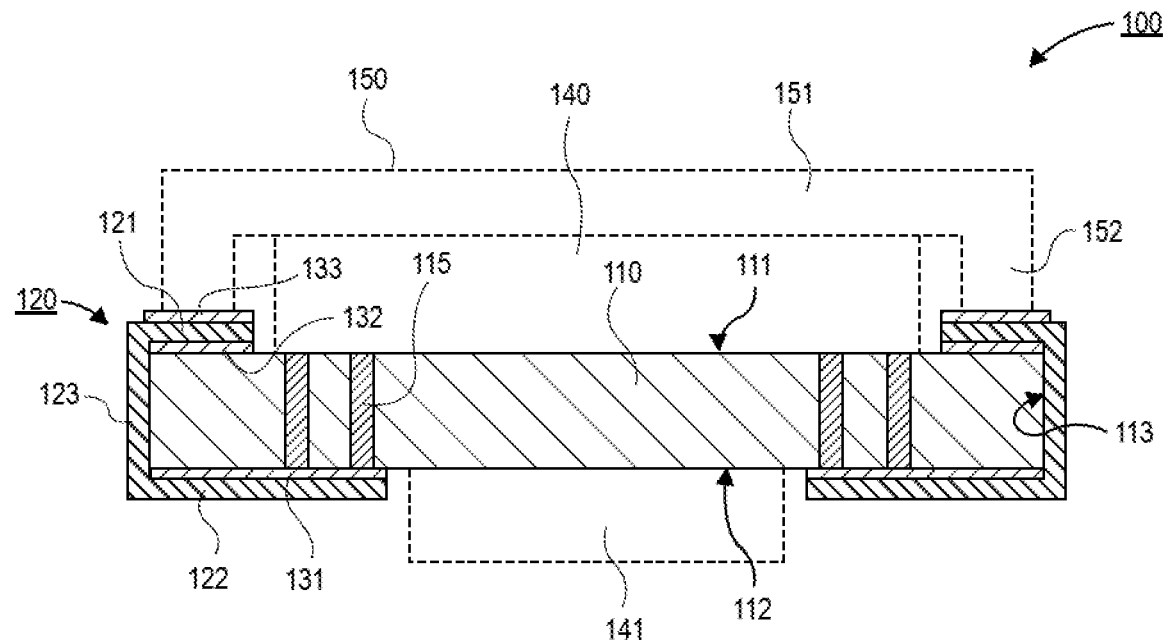
FIG. 1B is a cross-sectional illustration of an electronic package for accommodating die modules on two surfaces that includes a WAHS, in accordance with an embodiment.

Referring now to FIG. 1B, a cross-sectional illustration of an electronic package 100 is shown, in accordance with an additional embodiment. In an embodiment, the electronic package 100 in FIG. 1B may be substantially similar to the electronic package 100 in FIG. 1A, with the exception that a second die module 141 is attached to the second surface 112 of the package substrate 110. The second die module 141 may be thermally coupled to the WAHS 120. As such, heat generated by the second die module 141 may be propagated to the IHS 150 over the first surface 111 without needing to pass through a thickness of the package substrate 110. Therefore, a second thermal solution (e.g., a second IHS) dedicated to the second die module 141 is not needed. This provides a cost and size savings for the electronic package 100.

Figure 1C:
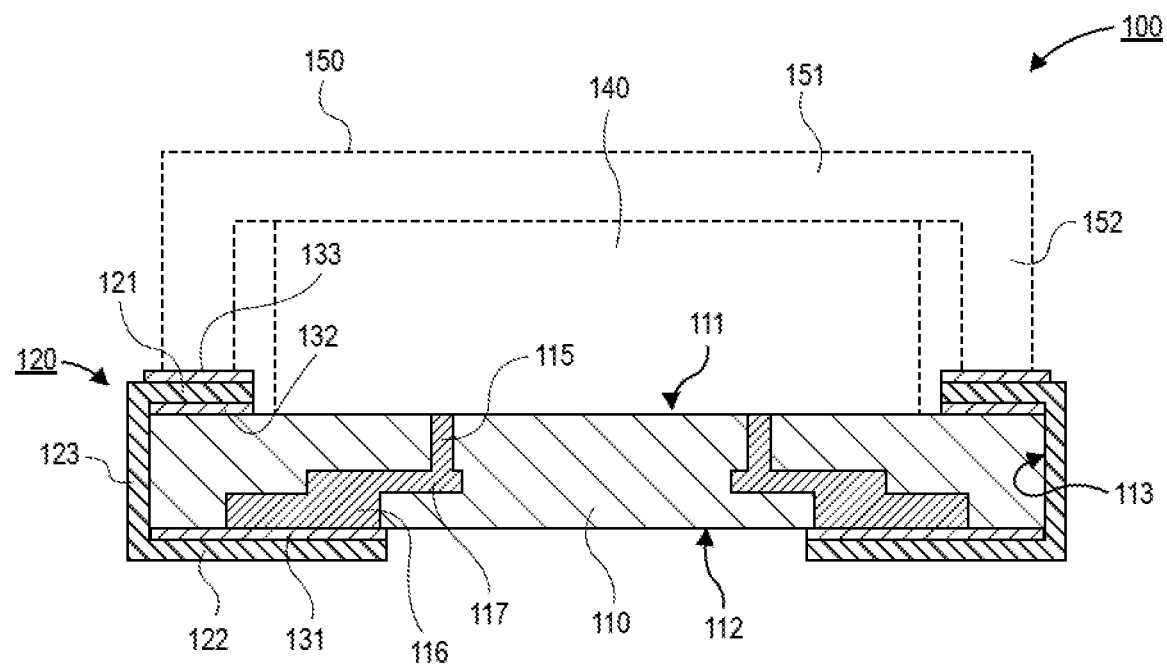
FIG. 1C is a cross-sectional illustration of an electronic package with a WAHS that includes thermal slugs embedded in the package substrate, in accordance with an embodiment.

Referring now to FIG. 1C, a cross-sectional illustration of an electronic package 100 is shown, in accordance with an embodiment. In an embodiment, the electronic package 100 is substantially similar to the electronic package 100 in FIG. 1A, with the exception that the thermal vias 115 are augmented by thermal slugs 116. In an embodiment, one or more thermal slugs 116 may be embedded into the package substrate 110. The thermal slugs 116 comprise a high thermal conductivity material. In a particular embodiment, the thermal slugs 116 comprise copper or other metallic material. The thermal slugs 116 provide additional thermal mass along the primary thermal path from the die module 140 to the IHS 150. In an embodiment, the thermal slugs 116 may be thermally coupled to one or more thermal vias 115. For example, a thermal trace 117 may connect the thermal slug 116 to the thermal via 115. In an embodiment, the thermal slugs 116 may directly interface with the TIM 131. The thermal slugs 116 may also increase a surface area of thermally conductive material that interfaces with the TIM 131 and the WAHS 120. Accordingly, the WAHS 120 is able to extract more thermal energy from the die module 140.

Figure 1D:
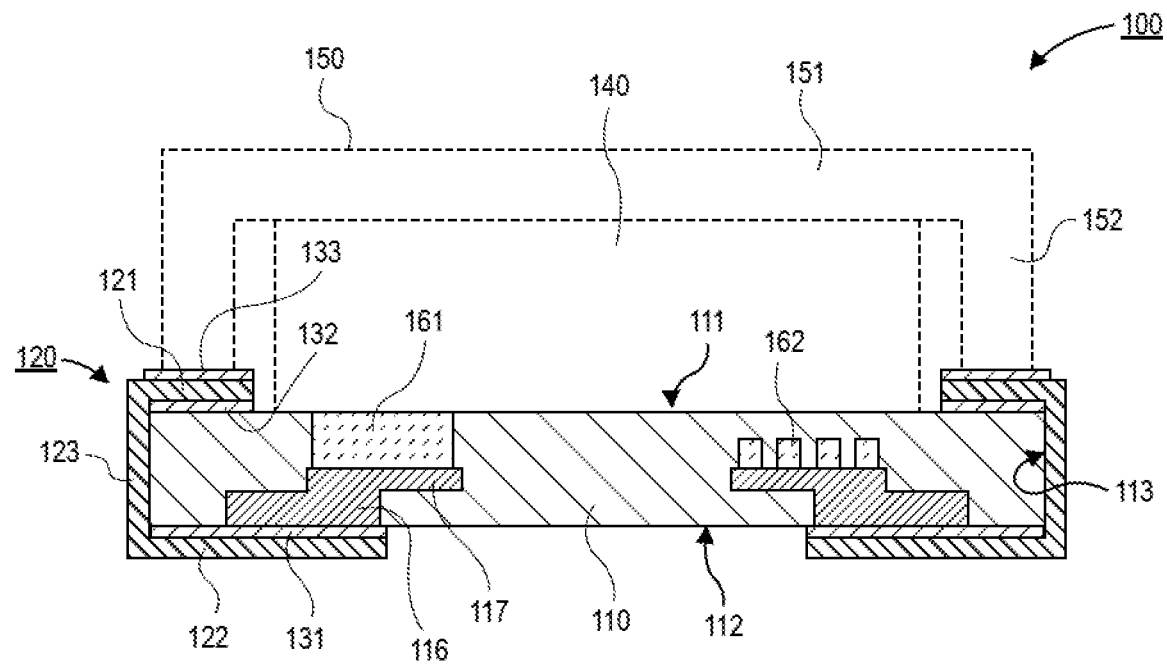
FIG. 1D is a cross-sectional illustration of an electronic package with a WAHS that includes components embedded in the package substrate that are thermally coupled to the WAHS, in accordance with an embodiment.

Referring now to FIG. 1D, a cross-sectional illustration of an electronic package 100 is shown, in accordance with an additional embodiment. The electronic package 100 in FIG. 1D may be substantially similar to the electronic package 100 in FIG. 1C, with the exception that the thermal slugs 116 are thermally coupled to one or more components 161 or 162 embedded in the substrate 110.

In one embodiment, component 161 may be a thermoelectric cooler (TEC). The TEC 161 may be positioned below the die module 140. A TEC 161 may provide active cooling to the die module 140. That is, a first surface (facing the die module 140) of the TEC 161 may be a cooling surface and a second surface (facing away from the die module 140) may be a heating surface. The heating surface may be thermally coupled to the WAHS 120 by a thermal slug 116 or the like. Accordingly, heat generated by the TEC 161 is rapidly removed from the package substrate 110 and propagated to the IHS 150 by the WAHS 120.

In another embodiment, additional components 162 may also be thermally controlled by being thermally coupled to a WAHS 120. Components 162 may include any discrete component suitable for electronic packaging. For example, the components 162 may be passive components, such as capacitors, voltage regulators, passive bridges, or the like. In an embodiment, the additional components 162 may also comprise active components, such as a die, an active bridge, or the like.

Figure 2A:
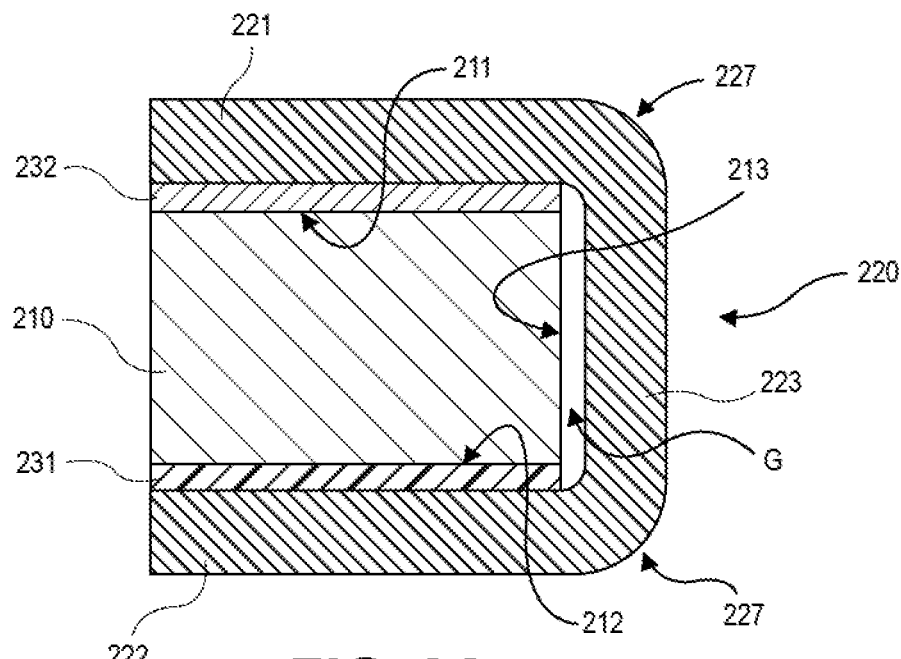
FIG. 2A is a cross-sectional illustration of an edge of the electronic package that more clearly illustrates a WAHS that is spaced away from the sidewall of the package substrate, in accordance with an embodiment.

Referring now to FIG. 2A, a cross-sectional illustration that more clearly depicts a structure of a WAHS 220 is shown, in accordance with an embodiment. As shown, the WAHS 220 may have a first portion 221 that is secured to a first surface 211 of a package substrate 210 by a sealant 232 or the like, and a second portion 222 that is secured to a second surface 212 of the package substrate 210 by a TIM 231. In an embodiment, a third portion 223 of the WAHS 220 attaches the first portion 221 to the second portion 222.

In an embodiment, the WAHS 220 is a monolithic structure. That is, the first portion 221, the second portion 222, and the third portion 223 are part of a single monolithic component. For example, the WAHS 220 may be a flexible body that is able to be wrapped around the sidewall 213 of the package substrate 210. As shown, the WAHS 220 may have curved corners 227 indicative of the WAHS 220 bending.

In some embodiments, the WAHS 220 is not secured to the sidewall surface 213 of the package substrate 210. For example, as shown in FIG. 2A, the third portion 223 is spaced away from the sidewall 213 by a gap G. In other embodiments, the WAHS 220 may be in direct contact with the sidewall 213. That is, there may not be a gap G between the third portion 223 and the sidewall 213.

Figure 2B:
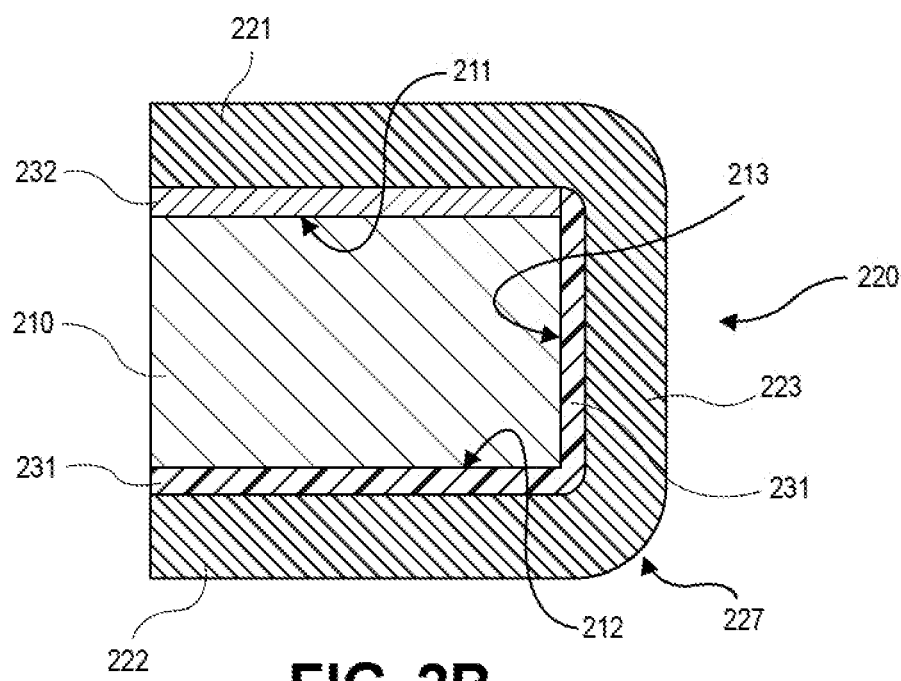
FIG. 2B is a cross-sectional illustration of an edge of the electronic package that more clearly illustrates a WAHS that is secured to the sidewall of the package substrate, in accordance with an embodiment.

Referring now to FIG. 2B, a cross-sectional illustration that more clearly depicts an alternative structure of a WAHS 220 is shown, in accordance with an additional embodiment. In an embodiment, the third portion 223 of the WAHS 220 may be secured to the sidewall 213 of the package substrate 210. For example, a portion of the TIM 231 may wrap around the corner and extend along the sidewall 213. As such, additional portions of the package substrate 210 may be thermally coupled to the WAHS 220 in order to further improve thermal performance. In other embodiments, the TIM 231 on the sidewall 213 may be replaced with any suitable adhesive.

Figure 3A:
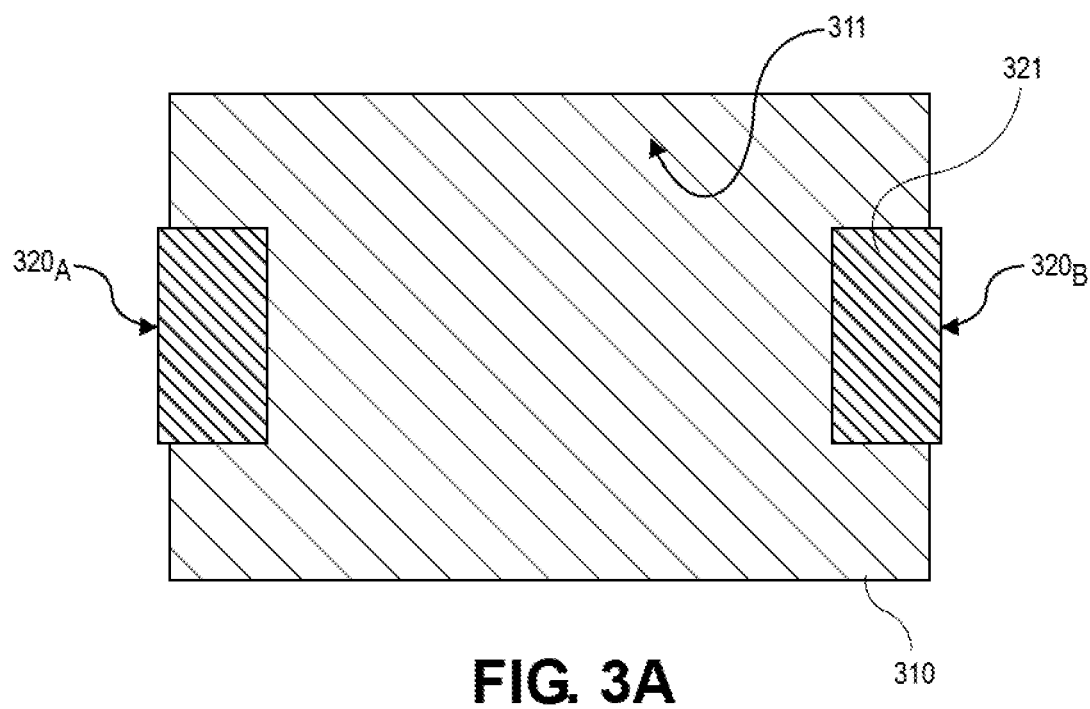
FIG. 3A is a plan view illustration of a top surface of an electronic package that comprises a pair of WAHSs, in accordance with an embodiment.

Referring now to FIG. 3A, a top view illustration of the package substrate 310 is shown, in accordance with an embodiment. In the illustrated view, the first surface 311 of the package substrate 310 is shown. In an embodiment, a pair of WAHSs 320 extend over the first surface 311. For example, a first WAHS 320A wraps around the left edge of the package substrate 310 and a second WAHS 320B wraps around the right edge of the package substrate 310. As shown, the first portions 321 of the WAHSs 320 extend towards the center of the package substrate 310. The area of the first portions 321 may be suitable for accepting supports of an IHS (not shown). In the illustrated embodiment, the first WAHS 320A and the second WAHS 320B are shown as being on opposite edges of the package substrate 310. However, it is to be appreciated that WAHSs 320 may be on any of the edges of the package substrate 310, depending on the routing and thermal requirements of the electronic package.

Figure 3B:
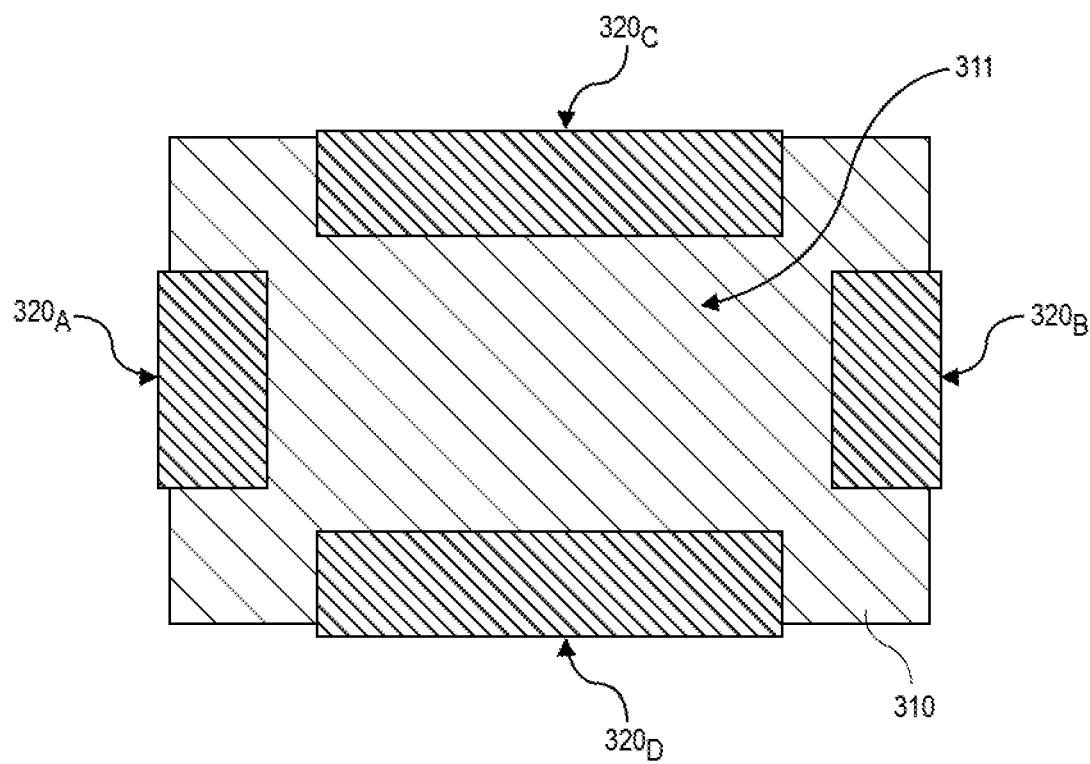
FIG. 3B is a plan view illustration of a top surface of an electronic package that comprises a plurality of WAHSs, in accordance with an additional embodiment.

Referring now to FIG. 3B, a top view illustration of the package substrate 310 is shown, in accordance with an additional embodiment. As shown, the package substrate 310 comprises a plurality of WAHSs 320A-D. For example, a WAHS 320 is located over each of the four edges of the package substrate. In the illustrated embodiment, each edge of the package substrate 310 comprises a single WAHS 320. However, in additional embodiments, one or more edges of the package substrate 310 may comprise a plurality of WAHSs 320, depending on the routing and thermal requirements.

Figure 4A:
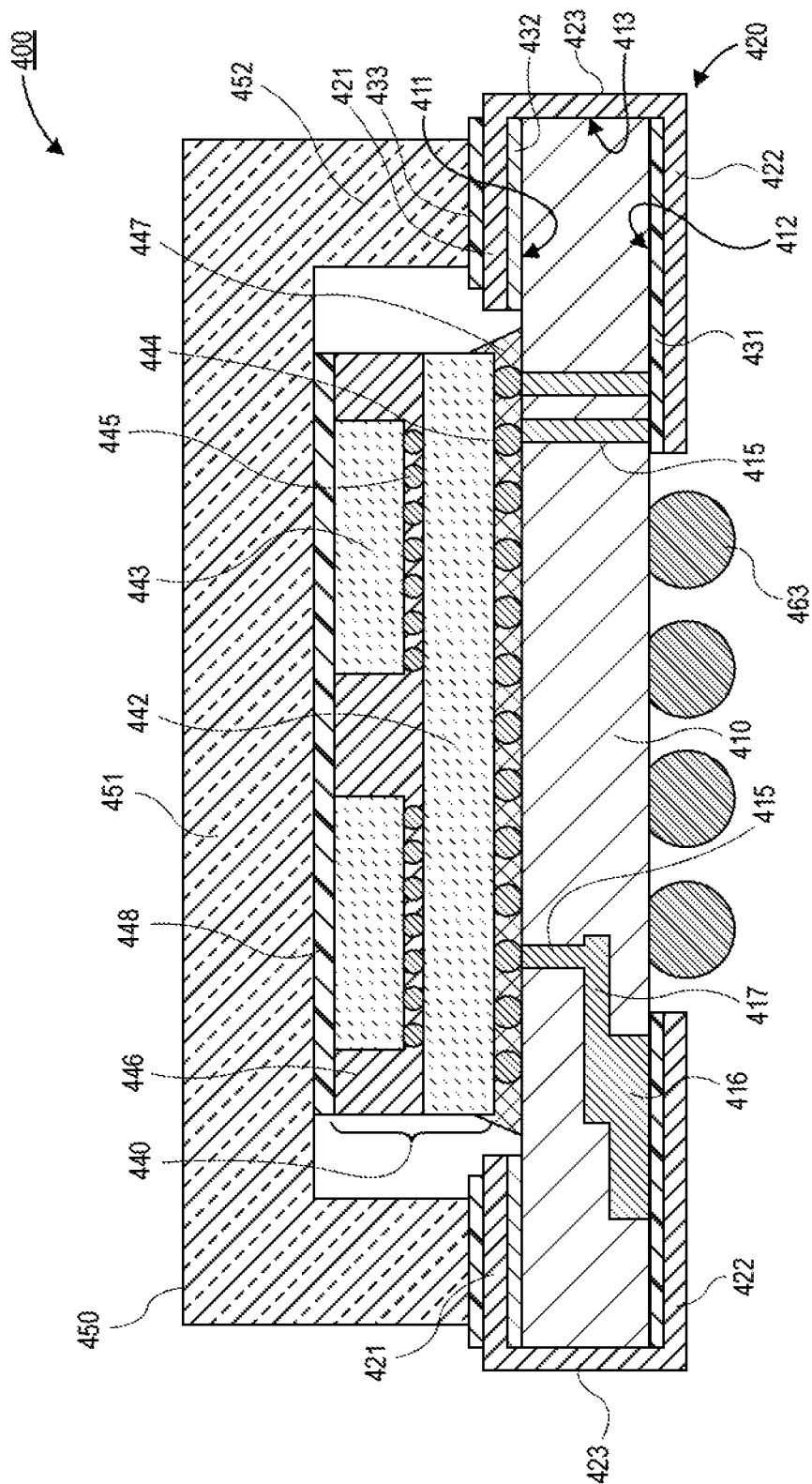
FIG. 4A is a cross-sectional illustration of an electronic package with a 3D die stack and a WAHS, in accordance with an embodiment.

Referring now to FIG. 4A, a cross-sectional illustration of an electronic package 400 is shown, in accordance with an embodiment. In an embodiment, the electronic package 400 may comprise a package substrate 410 and a die module 440 over the package substrate 410. An IHS 450 may be thermally coupled to a top surface of the die module 440. For example, a main body 451 of the IHS 450 may be thermally coupled to the top surface of the die module 440 by a TIM 448. In an embodiment, the IHS 450 may also comprise one or more supports 452 that extend down towards the package substrate 410.

In an embodiment, the die module 440 may comprise a plurality of dies and have a 3D architecture. For example, the illustrated die module 440 may comprise a first die 442, and a plurality of second dies 443 that are attached to the backside surface of the first die 442 by interconnects 445. In an embodiment, the second dies 443 may be electrically coupled to the first die 442 by vias (not shown) through the first die 442. In an embodiment, the second dies 443 may be embedded in a mold layer 446, such as epoxy.

In the illustrated embodiment, a single first die 442 is shown. Alternative embodiments may include a plurality of first dies 442. For example, a plurality of first dies 442 may be electrically coupled together by a bridge embedded in the package substrate 410. In an embodiment, the first die 442 is electrically coupled to the package substrate 410 by interconnects 444. In an embodiment, the interconnects 444 may be surrounded by an underfill 447. In an embodiment, the underfill 447 may be optimized for thermal performance. For example, the underfill 447 may be an epoxy with high thermal conductivity fillers or the like.

3D architectures, such as the one illustrated in FIG. 4A provide significant thermal challenges. While the backside surfaces of the second dies 443 are directly connected to the main body 451 of the IHS 450 by the TIM 448, there is no direct thermal path to the IHS 450 for the bottom first die 442. Accordingly, embodiments disclosed herein include a primary thermal path that passes through the package substrate 410 and wraps around the sidewall 413 outside of the package substrate 410, and back to the supports 452 of the IHS 450 over the first surface 411 of the package substrate 410.

In an embodiment, the primary thermal path through the package substrate 410 may include thermal vias 415. The thermal vias 415 may be below a footprint of the first die 442. In some embodiments, the thermal vias 415 pass through an entire thickness of the package substrate 410. For example, the pair of thermal vias 415 on the right side of the package substrate 410 pass through the entire thickness of the package substrate 410. In other embodiments, thermal vias 415 may optionally be used in conjunction with other thermal features. For example, thermal vias 415 may be thermally coupled to traces 417 and/or thermal slugs 416 embedded in the package substrate 410.

In an embodiment, the primary thermal path for heat transferred from the bottom die 442 to the IHS 450 outside of the package substrate 410 is provided along the WAHS 420. The WAHS 420 may comprise a first portion 421 secured to the first surface 411 of the package substrate 410, and a second portion 422 secured to the second surface 412 of the package substrate 410. A third portion 423 passes over the sidewall 413 of the package substrate 410 and connects the first portion 421 to the second portion 422. In an embodiment, the WAHS 420 is a monolithic structure that is flexible to allow for the attachment to both the first surface 411 and the second surface 412 of the package substrate 410. The WAHS 420 is a structure with a high in-plane thermal conductivity. For example, the WAHS 420 may comprise high conductivity graphite or graphene sheets, a heat pipe, or a vapor chamber.

In an embodiment, the first portion 421 of the WAHS 420 is secured to the first surface 411 of the package substrate 410 by a sealant 432 or other adhesive. In an embodiment, the second portion 422 of the WAHS 420 is secured to the second surface 412 of the package substrate 410 by a TIM 431. The use of a TIM 431 allows for improved thermal propagation from the bottom of the thermal features in the package substrate 410 (e.g., thermal vias 415, thermal slugs 416, etc.) to the WAHS 420. In an embodiment, the TIM 431 is over an entire interface between the WAHS 420 and the second surface 412 of the package substrate 410. This allows for thermal energy to be pulled from the package substrate 410 even outside of the thermal features (e.g., thermal vias 415, thermal slugs 416, etc.).

In an embodiment, the second portion 422 of the WAHS 420 extends below a footprint of the first die 442. Accordingly, the primary thermal path through the package substrate 410 may be a substantially vertical path in some embodiments. For example, on the right side of the package substrate 410, thermal vias 415 drop vertically from below the first die 442 and are thermally coupled to the second portion 422 of the WAHS 420 by the TIM 431.

In an embodiment, the second portion 422 of the WAHS 420 is routed to avoid the interconnects 463. As shown, the second level interconnects (SLIs) 463 are positioned between the pair of second portions 422. In an embodiment, a thickness of the WAHSs 420 is also smaller than the standoff height of the SLIs 463. Accordingly, standard mounting processes may be used to secure the electronic package 400 to a board or the like.

In an embodiment, the thermal features may also route thermal energy from locations below the first die 442 to the periphery of the package substrate 410. For example, one or more hot spots at various locations of the first die 442 may be thermally coupled to the WAHS 420. An example of such routing is provided on the left side of the package substrate 410. As shown, a via 415 may be located below a hot spot of the first die 442 and route the thermal energy towards the periphery by using thermal traces 417 or the like. In the illustrated embodiment, the thermal trace 417 is connected to a thermal slug 416. The thermal slug 416 is thermally coupled to the second portion of the WAHS 420 by the TIM 431.

In an embodiment, the WAHSs 420 are thermally coupled to the supports 452 of the IHS 450. As shown, each of the supports 452 may land on a first portion 421 of a WAHS 420. Thermal coupling between the bottom surface of the supports 452 and the top surface of the first portion 421 of the WAHS 420 may be improved by utilizing a TIM 433 at the interface.

Figure 4B:
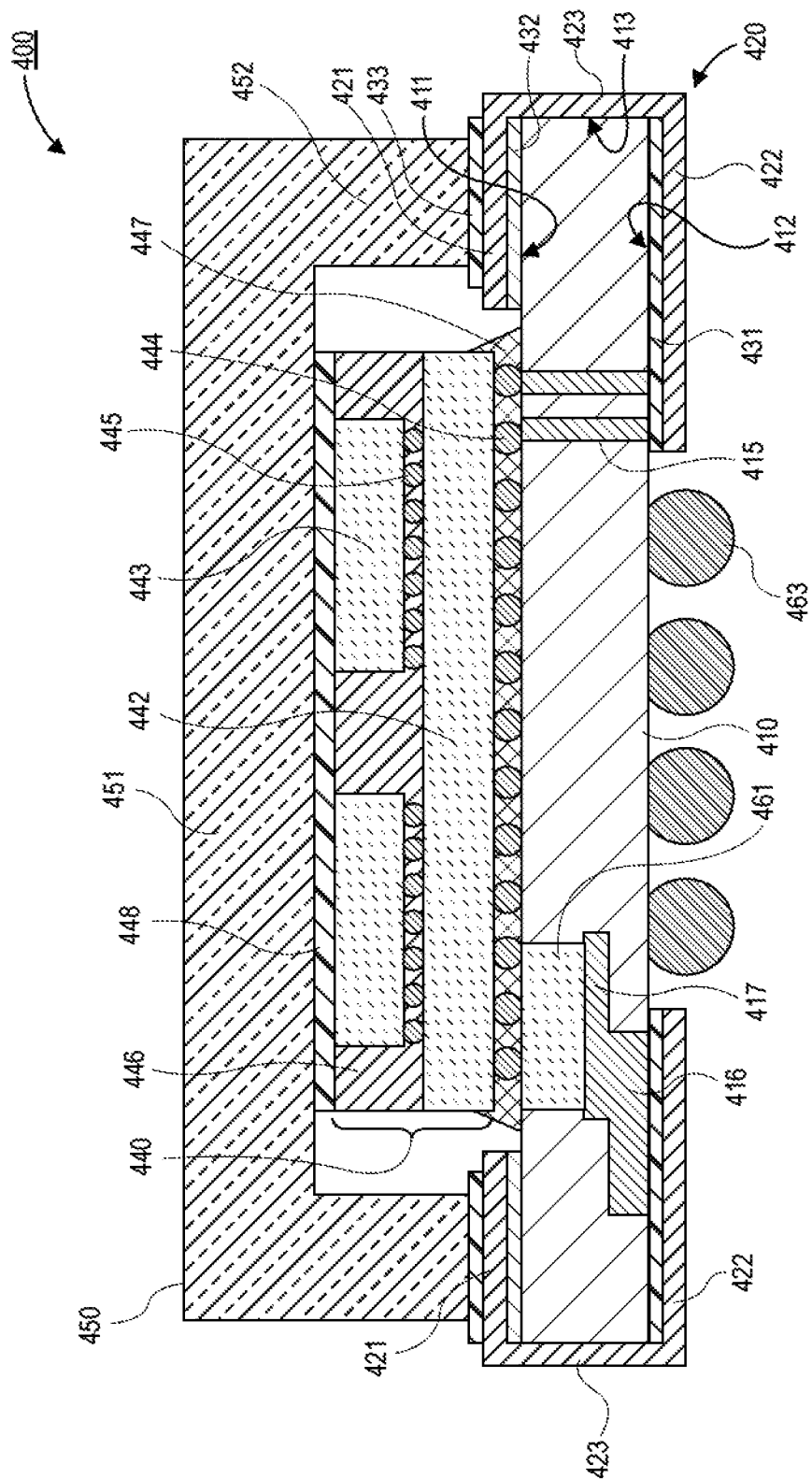
FIG. 4B is a cross-sectional illustration of an electronic package with a 3D die stack and an embedded component that is thermally coupled to a WAHS, in accordance with an embodiment.

Referring now to FIG. 4B, a cross-sectional illustration of an electronic package 400 is shown, in accordance with an additional embodiment. The electronic package 400 in FIG. 4B may be substantially similar to the electronic package 400 in FIG. 4A, with the exception that one or more components 461 are embedded in the package substrate 410. In a particular embodiment, the component 461 is a TEC. In such embodiments, the cooling surface of the TEC 461 faces the first die 442 and the heating surface of the TEC 461 faces the bottom surface of the package substrate 410. The bottom surface of the TEC 461 may be thermally coupled to the second portion 422 of the WAHS 420. Accordingly, active cooling may also be used in conjunction with the WAHS 420 to provide even greater thermal control of the electronic package 400.

Figure 4C:
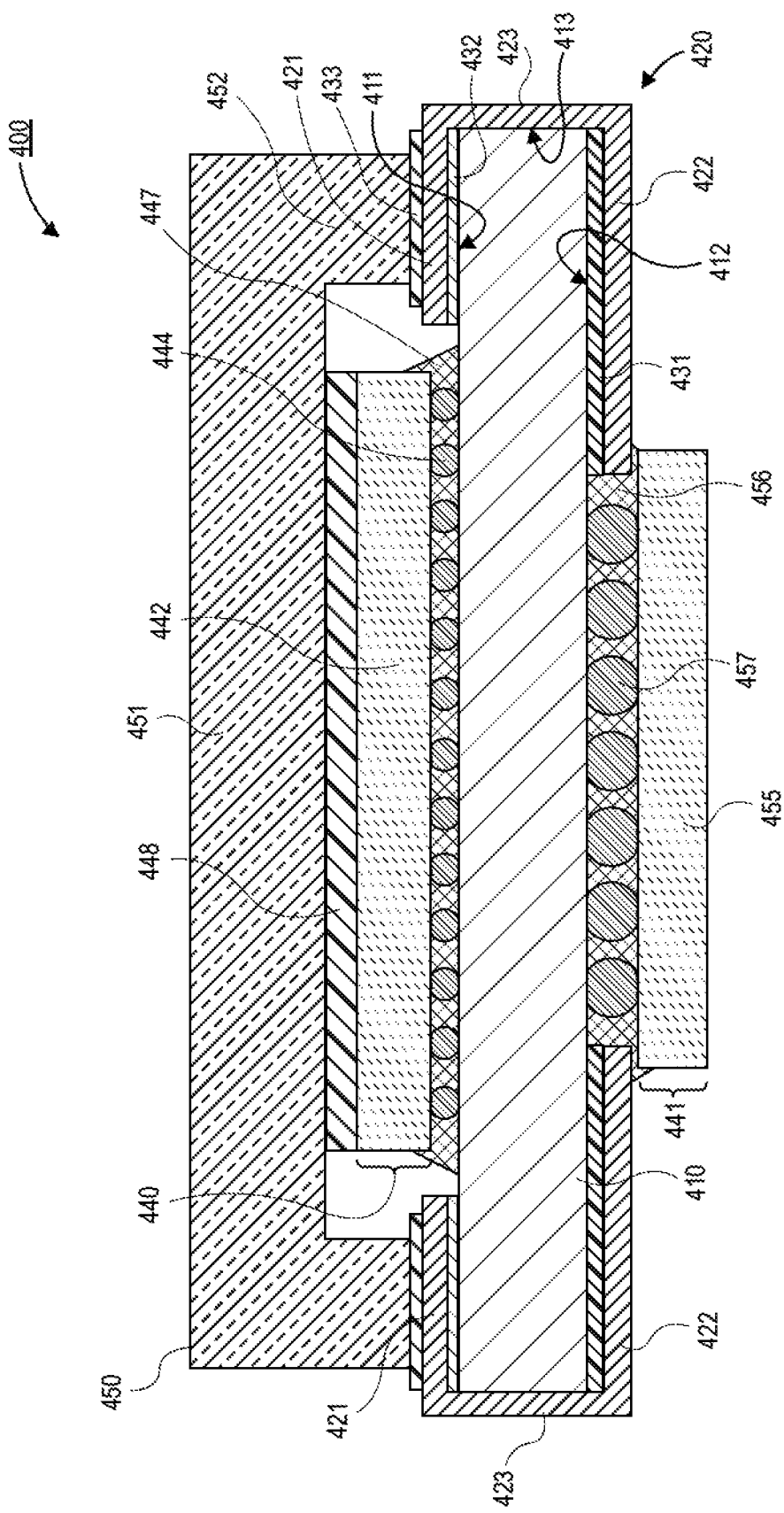
FIG. 4C is a cross-sectional illustration of an electronic package with a first die module and a second die module on an opposite surface, where the second die module is thermally coupled to a WAHS, in accordance with an embodiment.

Referring now to FIG. 4C, a cross-sectional illustration of an electronic package 400 is shown, in accordance with an additional embodiment. In an embodiment, the electronic package 400 comprises a first die module 440 and a second die module 441. In an embodiment, the first die module 440 is attached to the first surface 411 of the package substrate 410, and the second die module 441 is attached to the second surface 412 of the package substrate 410.

In an embodiment, the first die module 440 comprises a first die 442. The first die 442 is thermally coupled to the main body 451 of the IHS 450 by a TIM 448. The second die module 441 comprises a second die 455. Since the second die 455 is on the opposite side of the package substrate 410, there is no direct connection to the IHS 450. Accordingly, embodiments include using the WAHSs 420 to route thermal energy from the second die 455 to the supports 452 of the IHS 450.

In an embodiment, the second die 455 is attached to the second surface 412 of the package substrate 410 by interconnects 457. The interconnects 457 may be surrounded by an underfill 456. In an embodiment, the underfill 456 is a high thermal conductivity underfill 456. For example, the underfill 456 may comprise epoxy with high thermal conductivity fillers or the like. The underfill 456 may be in direct contact with the second portions 422 of the WAHSs 420. Accordingly, thermal energy from the second die 455 is propagated through the underfill 456 to the WAHS 420, and up to the support 452 of the IHS 450. Accordingly, the thermal energy does not need to pass through the organic package substrate 410 that has a low thermal conductivity.

Figure 4D:
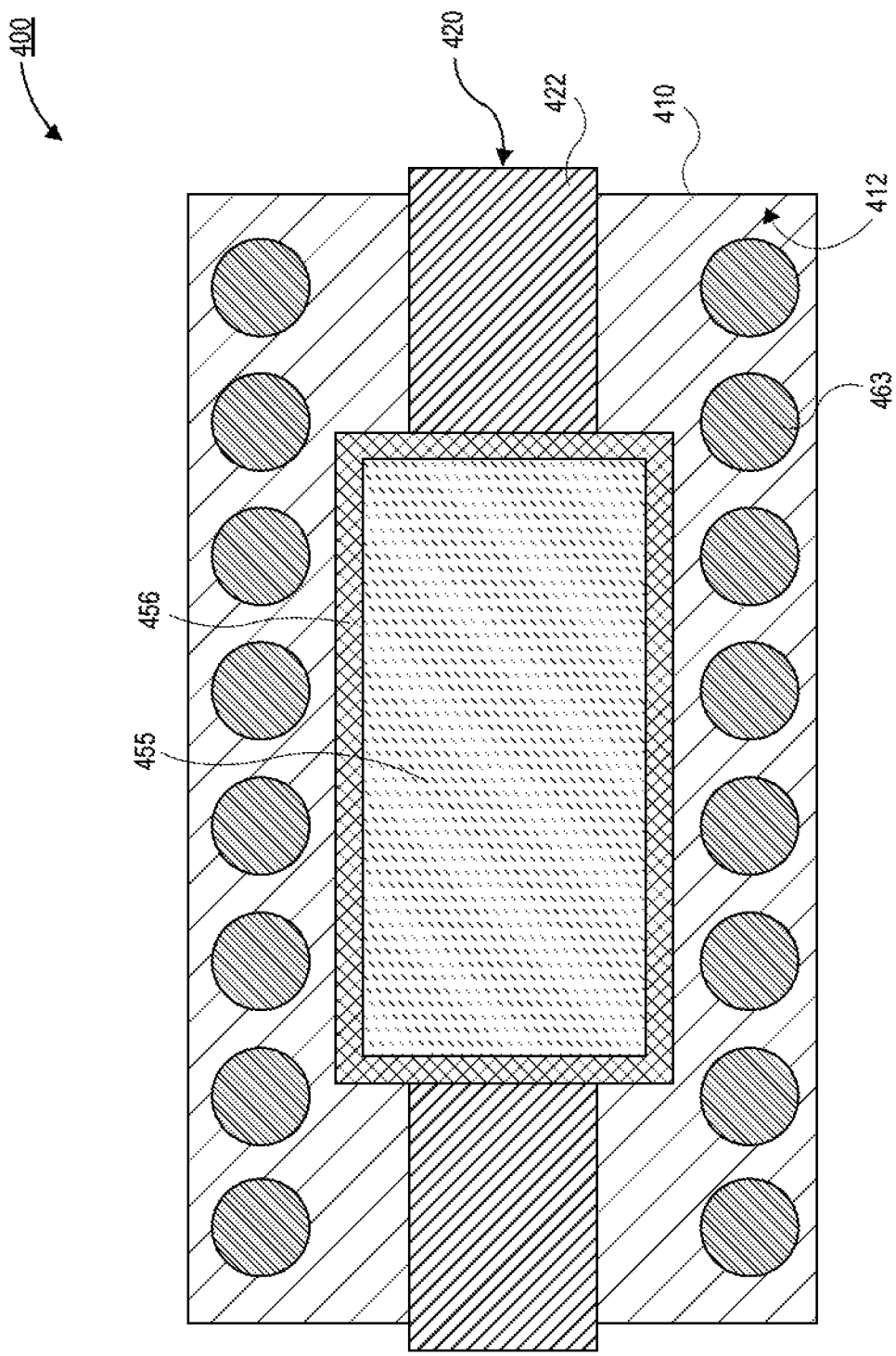
FIG. 4D is a plan view illustration of a bottom surface of an electronic package with a WAHS, in accordance with an embodiment.

Referring now to FIG. 4D, a plan view illustration of the second surface 412 of the electronic package 400 in FIG. 4C is shown, in accordance with an embodiment. As shown, the second portions 422 extend along the second surface 412 and are in contact with the underfill 456. In some embodiments, the second portions 422 extend below the underfill 456. The plan view illustration also depicts the clearance for the SLIs 463. As shown, the SLIs 463 are in rows that are out of the plane illustrated in FIG. 4C.

Figure 5:
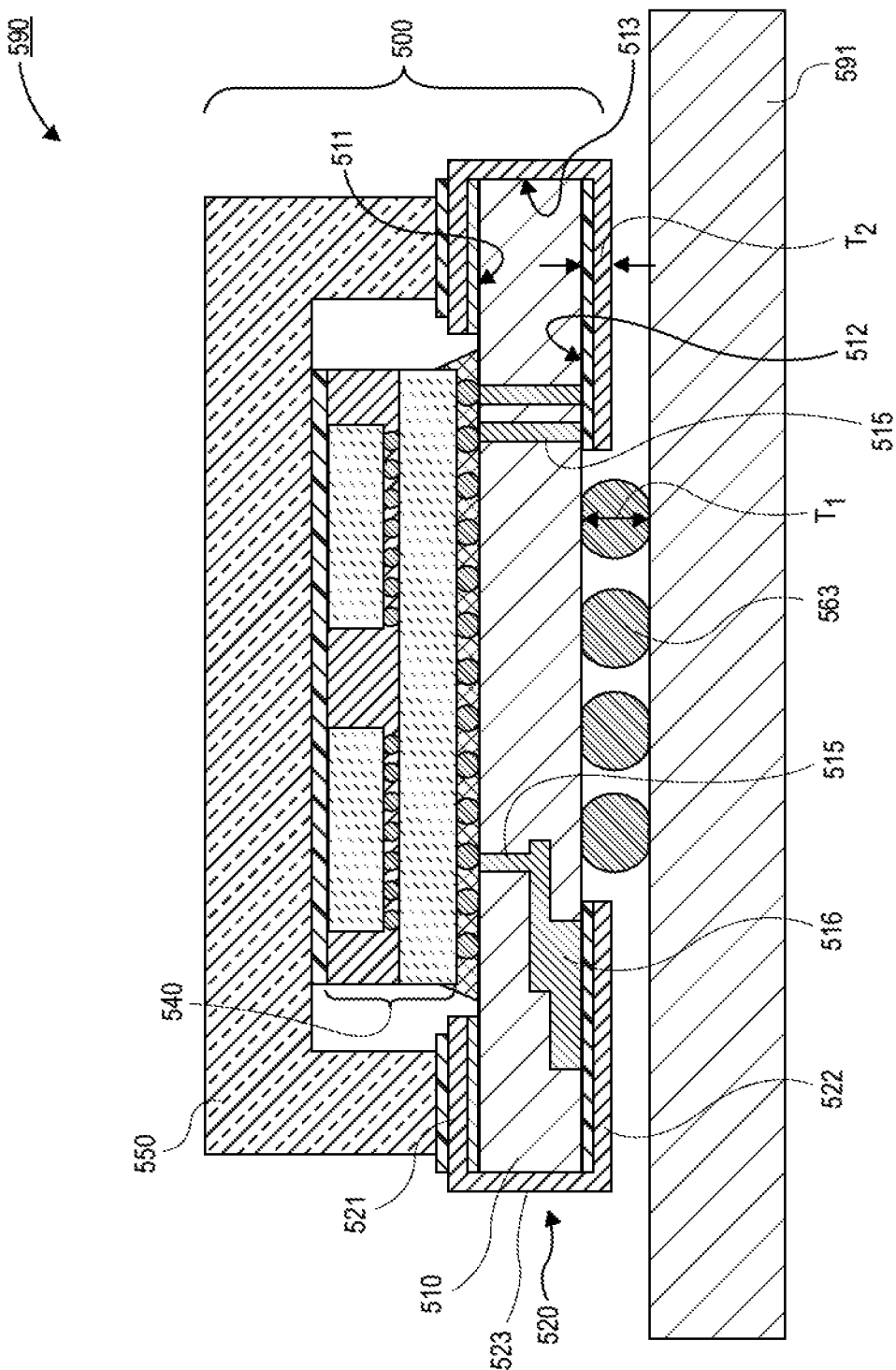
FIG. 5 is a cross-sectional illustration of an electronic system that includes an electronic package with a WAHS, in accordance with an embodiment.

Referring now to FIG. 5, a cross-sectional illustration of an electronic system 590 is shown, in accordance with an embodiment. In an embodiment, the electronic system 590 comprises an electronic package 500 that is secured to a board 591. The board 591 may be a motherboard or the like. In an embodiment, the electronic package 500 is attached to the board 591 with interconnects 563. In the illustrated embodiment, the interconnects 563 are shown as solder balls, but it is to be appreciated that any suitable interconnect architecture may be used so long as there is clearance for the WAHS 520. For example, a standoff height $T_1$ of the interconnects 563 will be larger than a combined thickness $T_2$ of the second portion 522 of the WAHS 520 and any adhesive (or TIM) used to secure the second portion 522 to the second surface 512.

In an embodiment, the electronic package 500 comprises a package substrate 510, a WAHS 520, a die module 540, and an IHS 550. In an embodiment, the die module 540 may comprise one or more dies. For example, a 3D die architecture is shown in FIG. 5. While an electronic package 500 with a single die module 540 over a first surface 511 of the package substrate 510 is shown, it is to be appreciated that electronic packages 500 with any number of die modules 540 over one or both surfaces 511 and 512 may be included in the electronic package 500.

In an embodiment, the WAHS 520 comprises a first portion 521 on the first surface 511 of the package substrate 510, a second portion 522 on the second surface 512 of the package substrate 510, and a third portion 523 that wraps along a sidewall surface 513 of the package substrate 510. The WAHS 520 may be thermally coupled to thermal features 515 and/or 516 in the package substrate 510 and to the IHS 550 by a TIM or the like.

Figure 6:
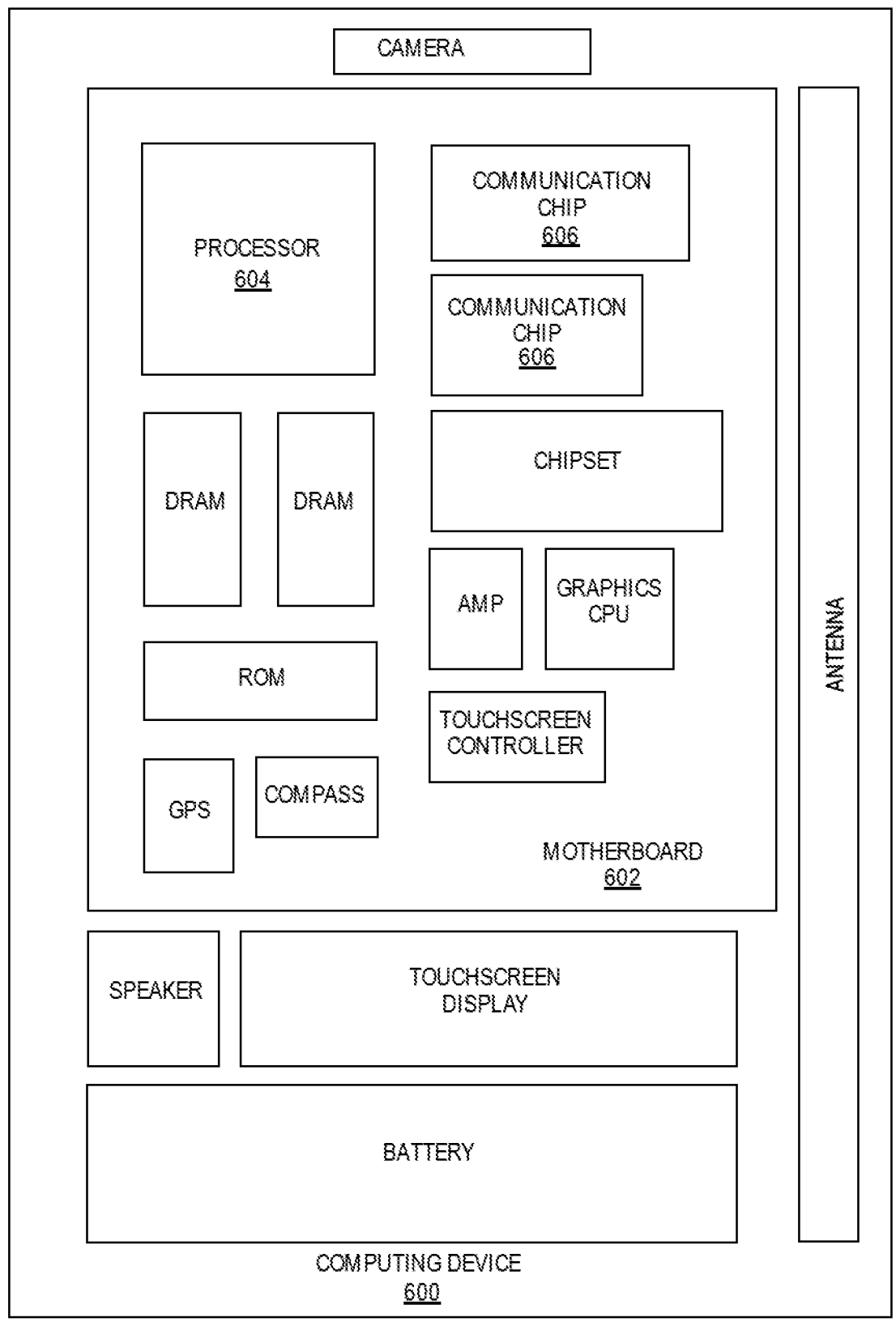
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor 604 may be part of an electronic package that comprises a WAHS that wraps from a first surface to a second surface of the package substrate, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip 606 may be part of an electronic package that comprises a WAHS that wraps from a first surface to a second surface of the package substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate with a first surface, a second surface opposite from the first surface, and a sidewall surface connecting the first surface to the second surface; and a heat spreader, wherein a first portion of the heat spreader is attached to the first surface of the package substrate and a second portion of the heat spreader is attached to the second surface of the package substrate, and wherein a third portion of the heat spreader adjacent to the sidewall surface of the package substrate connects the first portion of the heat spreader to the second portion of the heat spreader.

Example 2: the electronic package of Example 1, wherein the third portion of the heat spreader is spaced away from the sidewall surface of the package substrate.

Example 3: the electronic package of Example 1, wherein the third portion of the heat spreader is secured to the sidewall surface of the package substrate.

Example 4: the electronic package of Examples 1-4, further comprising: a via through the package substrate from the first surface to the second surface, wherein the via is thermally coupled to the second portion of the heat spreader.

Example 5: the electronic package of Examples 1-4, further comprising: a thermally conductive slug embedded in the package substrate, wherein the thermally conductive slug is thermally coupled to the second portion of the heat spreader.

Example 6: the electronic package of Example 5, wherein the thermally conductive slug is thermally coupled to a component embedded in the package substrate.

Example 7: the electronic package of Example 6, wherein the component is a thermoelectric cooler, a capacitor, or a voltage regulator.

Example 8: the electronic package of Examples 1-7, wherein a first length of the first portion is smaller than a second length of the second portion.

Example 9: the electronic package of Examples 1-8, further comprising: a plurality of heat spreaders.

Example 10: the electronic package of Examples 1-9, wherein the heat spreader is flexible and wraps around the sidewall surface of the package substrate.

Example 11: the electronic package of Examples 1-10, wherein the heat spreader comprises, high thermal conductivity graphite, graphene sheets, a heat pipe, or a vapor chamber.

Example 12: an electronic package, comprising: a package substrate with a first surface and a second surface; a heat spreader that is attached to the first surface and the second surface of the package substrate; a first die module attached to the first surface of the package substrate; and an integrated heat spreader (IHS) that is thermally coupled to the heat spreader and the first die module.

Example 13: the electronic package of Example 12, wherein the first die module comprises: a first die that is attached to the first surface of the package substrate; and a plurality of second dies stacked over the first die.

Example 14: the electronic package of Example 12, further comprising: a second die module attached to the second surface of the package substrate.

Example 15: the electronic package of Examples 12-14, wherein the IHS comprises: a main body; and one or more supports extending down from the main body, wherein the main body is thermally coupled to the first die module, and wherein one or more of the supports are thermally coupled to the heat spreader.

Example 16: the electronic package of Examples 12-15, further comprising: one or more thermally conductive paths through the package substrate, wherein the one or more thermally conductive paths thermally couple the first die module to the heat spreader.

Example 17: the electronic package of Example 16, wherein the one or more thermally conductive paths comprise vias through a thickness of the package substrate.

Example 18: the electronic package of Example 16, wherein the one or more thermally conductive paths comprise metal traces or thermal slugs embedded in the package substrate.

Example 19: the electronic package of Examples 12-18, further comprising: a thermoelectric cooler with a cooling surface and a heating surface embedded in the package substrate within a footprint of the first die module, wherein the cooling surface faces the first die module, and wherein the heating surface is thermally coupled to the heat spreader by a thermally conductive path.

Example 20: the electronic package of Examples 12-19, further comprising: one or more passive devices embedded in the package substrate or on a surface of the package substrate, wherein the one or more passive devices are thermally coupled to the heat spreader by a thermally conductive path.

Example 21: the electronic package of Examples 12-20, further comprising: second level interconnects attached to the second surface of the package substrate, wherein the second level interconnects have a first thickness, and wherein the heat spreader has a second thickness that is less than the first thickness.

Example 22: the electronic package of Examples 12-21, wherein a first portion of the heat spreader attached to the first surface of the package substrate is outside of a footprint of the first die module, and wherein a second portion of the heat spreader attached to the second surface of the package substrate is at least partially within the footprint of the first die module.

Example 23: electronic system, comprising: a die module; an electronic package electrically coupled to the die module by first interconnects, wherein the electronic package comprises a first surface and a second surface opposite from the first surface; a heat spreader attached to the first surface and the second surface of the electronic package; an integrated heat spreader (IHS) thermally coupled to the die module and the heat spreader; and a board electrically coupled to the electronic package by second interconnects.

Example 24: the electronic system of Example 23, wherein the heat spreader is flexible and wraps around a sidewall surface of the electronic package.

Example 25: the electronic system of Example 23 or Example 24, wherein the heat spreader comprises, high thermal conductivity graphite, graphene sheets, a heat pipe, or a vapor chamber.

What is claimed is:

1. An electronic package, comprising:
a package substrate with a first surface, a second surface opposite from the first surface, and a sidewall surface connecting the first surface to the second surface;
a heat spreader, wherein a first portion of the heat spreader is attached to the first surface of the package substrate and a second portion of the heat spreader is attached to the second surface of the package substrate, wherein a third portion of the heat spreader adjacent to the sidewall surface of the package substrate connects the first portion of the heat spreader to the second portion of the heat spreader, and wherein the second portion of the heat spreader extends laterally beyond the first portion of the heat spreader; and
a thermally conductive slug embedded in the package substrate, wherein the thermally conductive slug is thermally coupled to the second portion of the heat spreader.

2. The electronic package of claim 1, wherein the third portion of the heat spreader is spaced away from the sidewall surface of the package substrate.

3. The electronic package of claim 1, wherein the third portion of the heat spreader is secured to the sidewall surface of the package substrate.

4. The electronic package of claim 1, further comprising:
a via through the package substrate from the first surface to the second surface, wherein the via is thermally coupled to the second portion of the heat spreader.

5. The electronic package of claim 1, wherein the thermally conductive slug is thermally coupled to a component embedded in the package substrate.

6. The electronic package of claim 5, wherein the component is a thermoelectric cooler, a capacitor, or a voltage regulator.

7. The electronic package of claim 1, wherein a first length of the first portion is smaller than a second length of the second portion.

8. The electronic package of claim 1, further comprising:
a plurality of heat spreaders.

9. The electronic package of claim 1, wherein the heat spreader is flexible and wraps around the sidewall surface of the package substrate.

10. The electronic package of claim 1, wherein the heat spreader comprises, high thermal conductivity graphite, graphene sheets, a heat pipe, or a vapor chamber.

11. An electronic package, comprising:
a package substrate with a first surface and a second surface;
a heat spreader that is attached to the first surface and the second surface of the package substrate;
a first die module attached to the first surface of the package substrate, wherein a first portion of the heat spreader attached to the first surface of the package substrate is outside of a footprint of the first die module, and wherein a second portion of the heat spreader attached to the second surface of the package substrate is at least partially within the footprint of the first die module; and
an integrated heat spreader (IHS) that is thermally coupled to the heat spreader and the first die module.

12. The electronic package of claim 11, wherein the first die module comprises:
a first die that is attached to the first surface of the package substrate; and
a plurality of second dies stacked over the first die.

13. The electronic package of claim 11, further comprising:
a second die module attached to the second surface of the package substrate.

14. The electronic package of claim 11, wherein the IHS comprises:
a main body; and
one or more supports extending down from the main body, wherein the main body is thermally coupled to the first die module, and wherein one or more of the supports are thermally coupled to the heat spreader.

15. The electronic package of claim 11, further comprising:
one or more thermally conductive paths through the package substrate, wherein the one or more thermally conductive paths thermally couple the first die module to the heat spreader.

16. The electronic package of claim 15, wherein the one or more thermally conductive paths comprise vias through a thickness of the package substrate.

17. The electronic package of claim 15, wherein the one or more thermally conductive paths comprise metal traces or thermal slugs embedded in the package substrate.

18. The electronic package of claim 11, further comprising:
a thermoelectric cooler with a cooling surface and a heating surface embedded in the package substrate within a footprint of the first die module, wherein the cooling surface faces the first die module, and wherein the heating surface is thermally coupled to the heat spreader by a thermally conductive path.

19. The electronic package of claim 11, further comprising:
one or more passive devices embedded in the package substrate or on a surface of the package substrate, wherein the one or more passive devices are thermally coupled to the heat spreader by a thermally conductive path.

20. The electronic package of claim 11, further comprising:
second level interconnects attached to the second surface of the package substrate, wherein the second level interconnects have a first thickness, and wherein the heat spreader has a second thickness that is less than the first thickness.

21. An electronic system, comprising:
a die module;
an electronic package electrically coupled to the die module by first interconnects, wherein the electronic package comprises a first surface and a second surface opposite from the first surface;
a heat spreader attached to the first surface and the second surface of the electronic package, and wherein a portion of the heat spreader on the second surface of the electronic package extends laterally beyond a portion of the heat spreader on the first surface of the electronic package;
a thermally conductive slug embedded in the electronic package, wherein the thermally conductive slug is thermally coupled to the portion of the heat spreader on the second surface of the electronic package;
an integrated heat spreader (IHS) thermally coupled to the die module and the heat spreader; and
a board electrically coupled to the electronic package by second interconnects.

22. The electronic system of claim 21, wherein the heat spreader is flexible and wraps around a sidewall surface of the electronic package.

23. The electronic system of claim 21, wherein the heat spreader comprises, high thermal conductivity graphite, graphene sheets, a heat pipe, or a vapor chamber.

24. An electronic package, comprising:
- a package substrate with a first surface, a second surface opposite from the first surface, and a sidewall surface connecting the first surface to the second surface;
- a heat spreader, wherein a first portion of the heat spreader is attached to the first surface of the package substrate and a second portion of the heat spreader is attached to the second surface of the package substrate, and wherein a third portion of the heat spreader adjacent to the sidewall surface of the package substrate connects the first portion of the heat spreader to the second portion of the heat spreader; and
- a thermally conductive slug embedded in the package substrate, wherein the thermally conductive slug is thermally coupled to the second portion of the heat spreader.

25. The electronic package of claim 24, wherein the thermally conductive slug is thermally coupled to a component embedded in the package substrate.

26. The electronic package of claim 25, wherein the component is a thermoelectric cooler, a capacitor, or a voltage regulator.

* * * * *